(12) United States Patent
Matsutori et al.

(10) Patent No.: US 11,448,330 B2
(45) Date of Patent: Sep. 20, 2022

(54) GAS PURGE PORT

(71) Applicant: Miraial Co., Ltd., Tokyo (JP)

(72) Inventors: Chiaki Matsutori, Tokyo (JP); Kouichi Nishizaka, Tokyo (JP)

(73) Assignee: MIRAIAL CO., LTD., Tokyo (JP)

( * ) Notice: Subject to any disclaimer, the term of this patent is extended or adjusted under 35 U.S.C. 154(b) by 258 days.

(21) Appl. No.: 16/770,428

(22) PCT Filed: Feb. 19, 2018

(86) PCT No.: PCT/JP2018/005795
§ 371 (c)(1),
(2) Date: Jun. 5, 2020

(87) PCT Pub. No.: WO2019/159369
PCT Pub. Date: Aug. 22, 2019

(65) Prior Publication Data
US 2020/0386334 A1 Dec. 10, 2020

(51) Int. Cl.
*H01L 21/673* (2006.01)
*F16K 15/12* (2006.01)
*F16K 15/02* (2006.01)

(52) U.S. Cl.
CPC ............ *F16K 15/12* (2013.01); *F16K 15/026* (2013.01)

(58) Field of Classification Search
CPC ............. F16K 15/026; H01L 21/67376; H01L 21/67389; H01L 21/67393
See application file for complete search history.

(56) References Cited

U.S. PATENT DOCUMENTS

| 6,187,182 | B1 | 2/2001 | Reynolds |
| 9,997,388 | B2* | 6/2018 | Smith ............... H01L 21/67393 |
| 10,453,723 | B2* | 10/2019 | Kasama ............... B01D 46/526 |
| 2005/0077204 | A1 | 4/2005 | Sumi |
| 2009/0266441 | A1 | 10/2009 | Sato |
| 2011/0091340 | A1 | 4/2011 | Sunagawa |
| 2011/0280756 | A1 | 11/2011 | Huang |
| 2018/0308733 | A1 | 10/2018 | Kasama |

FOREIGN PATENT DOCUMENTS

| JP | 2002521189 A | 7/2002 |
| JP | 2004146676 A | 5/2004 |
| JP | 2004179449 A | 6/2004 |
| JP | 2008066330 A | 3/2008 |
| JP | 4201583 B2 | 12/2008 |

(Continued)

*Primary Examiner* — Kevin F Murphy
(74) *Attorney, Agent, or Firm* — Muncy, Geissler, Olds & Lowe, P.C.

(57) ABSTRACT

A container main body has a container main body opening portion in one end portion. The lid body is attachable to and detachable from the container main body opening portion and capable of blocking the container main body opening portion. The gas purge port is provided with a seal face provided in at least one of a ventilation path forming portion and a part of the gas purge port other than the ventilation path forming portion and the check valve member and coming into close contact with a gas injection port. The seal face is provided with a close contact pad constituted by an elastic body for preventing gas leakage between the gas injection port and the seal face.

9 Claims, 10 Drawing Sheets

(56) References Cited

FOREIGN PATENT DOCUMENTS

| | | |
|---|---|---|
| JP | 4204302 B2 | 1/2009 |
| JP | 2011085087 A | 4/2011 |
| JP | 5241607 B2 | 7/2013 |
| JP | 2016096184 A | 5/2016 |
| JP | 2016180868 A | 10/2016 |
| JP | 2017147372 A | 8/2017 |
| KR | 20090060259 A | 6/2009 |
| KR | 101040540 B1 | 6/2011 |
| WO | WO-2000006286 A | 2/2000 |
| WO | WO-2016076111 A1 * | 5/2016 ......... B01D 46/0005 |

* cited by examiner

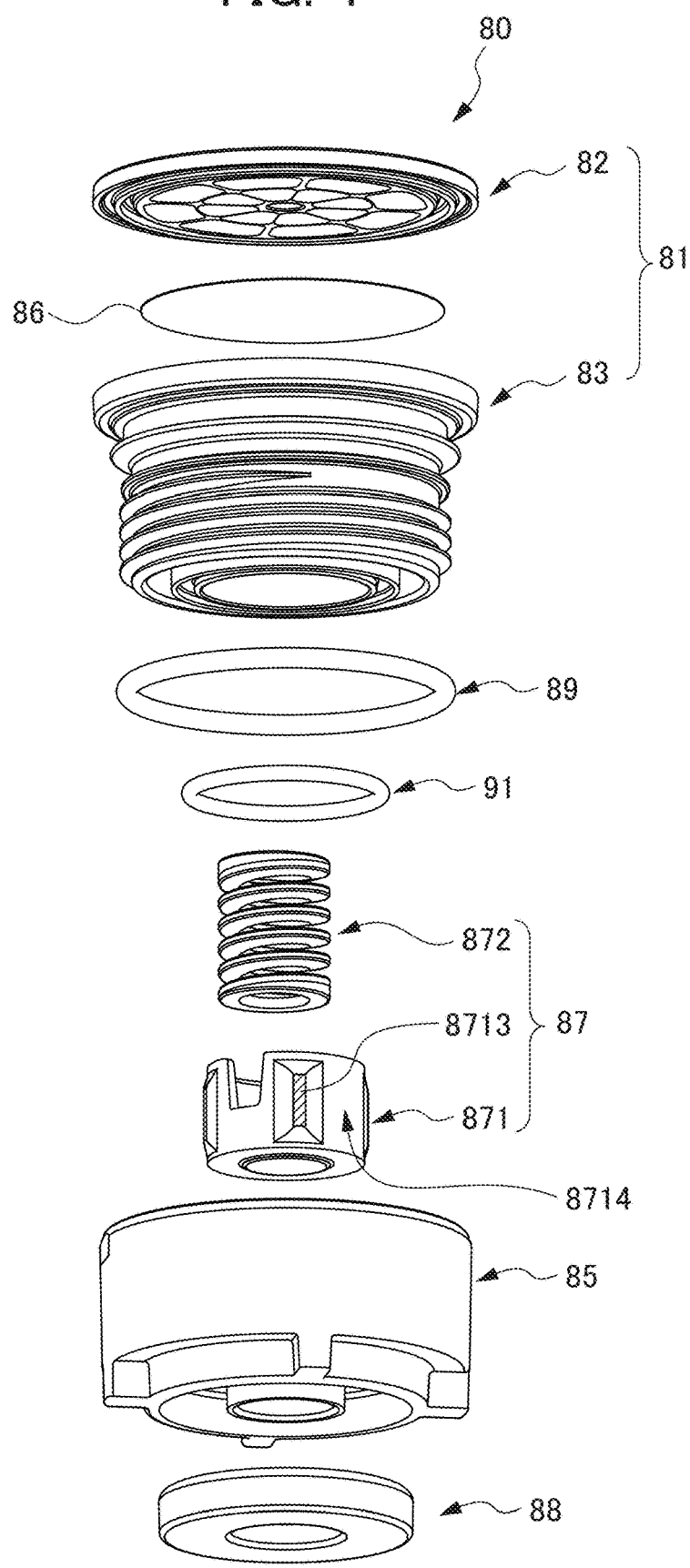

GAS PURGE PORT

TECHNICAL FIELD

The present invention relates to a gas purge port used for a storing container used when a substrate made of a semiconductor wafer or the like is stored, kept, transferred, transported, or the like.

BACKGROUND ART

Known in the related art is a storing container configured to include a container main body and a lid body in order to store a substrate made of a semiconductor wafer and transport or transfer the substrate in a process in a factory or by means of transport such as means of transport by land, air, and sea.

The container main body has a tubular wall portion. A container main body opening portion is formed in one end portion of the wall portion. The other end portion of the wall portion is blocked. The lid body can be attached to and detached from the container main body opening portion and is capable of blocking the container main body opening portion. A storing space storing the substrate or the like is formed in the storing container by the container main body being blocked by the lid body. The storing space is formed so as to be surrounded by the wall portion of the container main body and the inner face of the lid body. The storing space is capable of storing a plurality of substrates.

A front retainer is provided at the part of the lid body that faces the storing space when the container main body opening portion is blocked. The front retainer is capable of supporting the edge portions of the plurality of substrates when the container main body opening portion is blocked by the lid body. A back side substrate support portion is provided in the wall portion so as to make a pair with the front retainer. The back side substrate support portion is capable of supporting the edge portions of the plurality of substrates. When the container main body opening portion is blocked by the lid body, the back side substrate support portion supports the plurality of substrates in cooperation with the front retainer. As a result, the back side substrate support portion retains the plurality of substrates in a state where the adjacent substrates are separated from each other at a predetermined interval and arranged in parallel (see Patent Document 1 and Patent Document 2).

The container main body and the lid are provided with a filter. A check valve is provided in the filter as necessary. Gas purging is performed with respect to the storing space from the outside of the storing container, through the filter, and by means of inert gas such as nitrogen or moisture-removed (1% or less) dry air (hereinafter, referred to as purge gas). The check valve prevents the gas with which the storing space is filled as a result of gas purging from leaking (see Patent Document 3).

Patent Document 1: Japanese Patent No. 4204302
Patent Document 2: Japanese Patent No. 4201583
Patent Document 3: Japanese Patent No. 5241607

DISCLOSURE OF THE INVENTION

Problems to be Solved by the Invention

Semiconductor process refinement and semiconductor chip yield improvement have been demanded in recent years. In this regard, reducing outgas such as organic gas and chlorine gas from the material of the storing container, reducing a metal component, and reducing the humidity in the container to the maximum extent possible have been required for semiconductor wafer storing containers and so on.

Although gas purging is performed by means of the purge gas in this regard, the purge gas passes through the ventilation space in a check valve member provided with a metallic spring, and thus problems have arisen with the metal component that is contained in the metallic spring contained in the purge gas, the metal falling due to corrosion, concerns rising over particle adhesion, and keeping the environment in the storing container clean becoming impossible. This has resulted in a decline in semiconductor chip yield, which is another problem.

An object of the present invention is to provide a gas purge port capable of efficiently replacing the gas in the storing space of a storing container with purge gas and maintaining the cleanliness in the storing container.

Means for Solving the Problems

The present invention relates to a gas purge port attached to an access opening in a storing container in which a storing space is formed by a container main body and a lid body. The container main body has a container main body opening portion in one end portion. The lid body is attachable to and detachable from the container main body opening portion and capable of blocking the container main body opening portion. The access opening is formed in at least one of the container main body and the lid body and capable of allowing communication between a space outside the storing container and the storing space. The gas purge port includes a pipe-shaped ventilation path forming portion where a ventilation path capable of allowing ventilation between the outside of the storing container and the storing space is formed, a check valve member having a resin-molded spring prevented from being corroded by gas and a valve body biased by the spring and limiting a gas flow direction in the ventilation path to a certain direction, and a seal face provided in at least one of the ventilation path forming portion and a part of the gas purge port other than the ventilation path forming portion and the check valve member and coming into close contact with a gas injection port. The seal face is provided with a close contact pad constituted by an elastic body for preventing gas leakage between the gas injection port and the seal face.

It is preferable that the spring is molded with a thermoplastic resin having a tensile modulus of elasticity exceeding 2,000 Mpa when represented by Young's modulus.

It is preferable that the thermoplastic resin is made of at least one of polyether ether ketone, polycarbonate, and polyacetal.

It is preferable that the valve body can be opened and closed by pressure of gas flowing through the ventilation path. It is preferable that the close contact pad is formed in an annular shape. It is preferable that a hollow portion is formed in the close contact pad such that the close contact pad is capable of following the gas injection port. It is preferable that the ventilation path forming portion has a tapered face for performing sealing between the ventilation path and an outside of the ventilation path.

It is preferable that the check valve member closes and seals a ventilation path by the valve body having a tapered shape and abutting against a tapered stool seat of the check valve member. It is preferable that the gas purge port includes a gas-permeable membrane for filtration.

Effects of the Invention

According to the present invention, it is possible to provide a gas purge filter capable of efficiently replacing the gas in the storing space of a storing container with purge gas and maintaining the cleanliness in the storing container. Accordingly, the proportion at which a semiconductor wafer is exposed to inert gas or dry air can be increased, and thus it is possible to improve the yield of semiconductor chips manufactured on the semiconductor wafer. Further, purge gas-based gas replacement can be efficiently performed within a short time, and thus a shorter process time can be achieved along with cost reduction.

BRIEF DESCRIPTION OF THE DRAWINGS

FIG. 4 is an exploded perspective view illustrating the gas purge filter 80 according to the first embodiment of the present invention provided in an air supply hole.

PREFERRED MODE FOR CARRYING OUT THE INVENTION

First Embodiment

Figure 1:
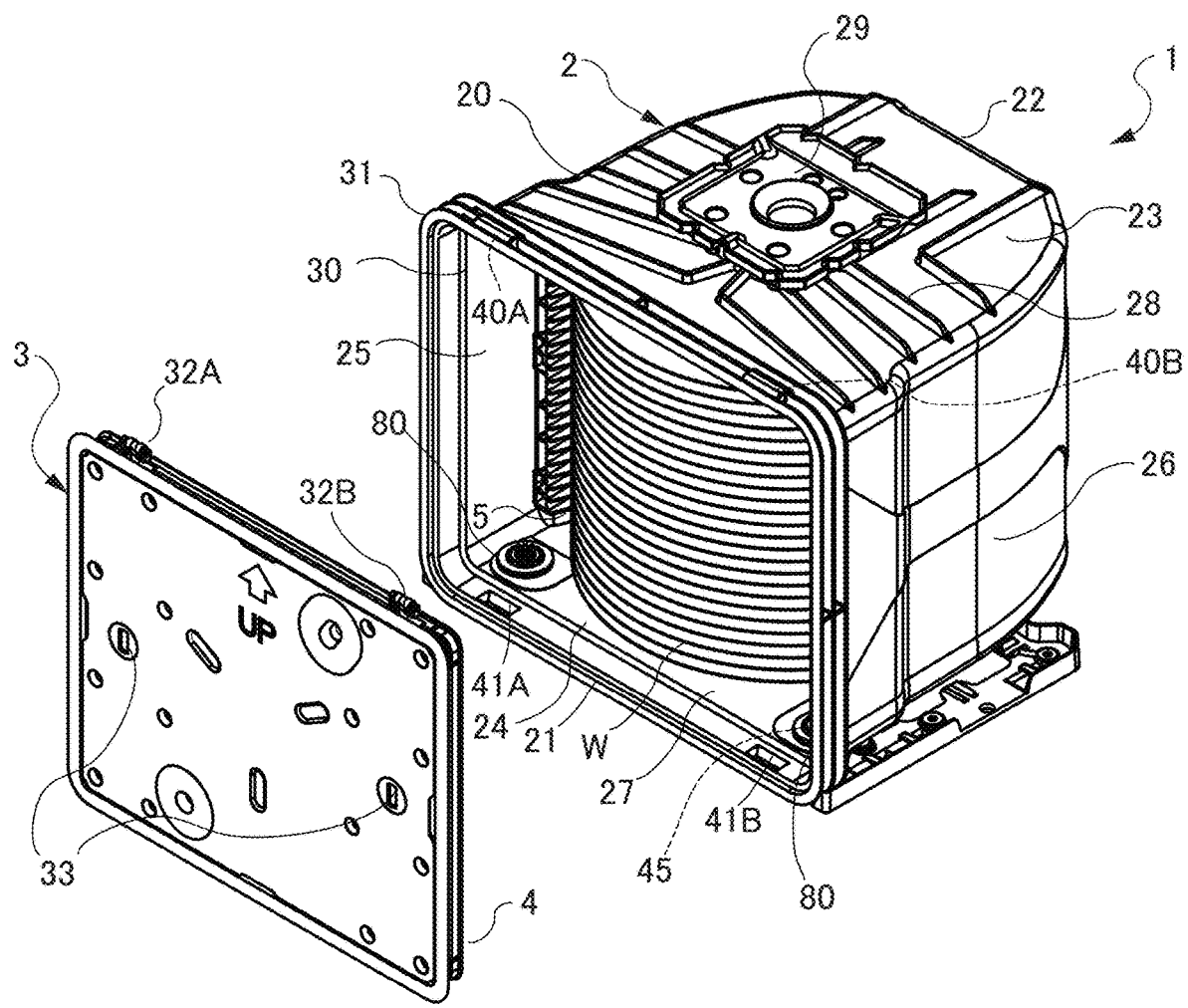
FIG. 1 is an exploded perspective view illustrating a state where a gas purge filter 80 according to a first embodiment of the present invention is attached to a storing container 1 and a substrate W is stored.
Figure 2:
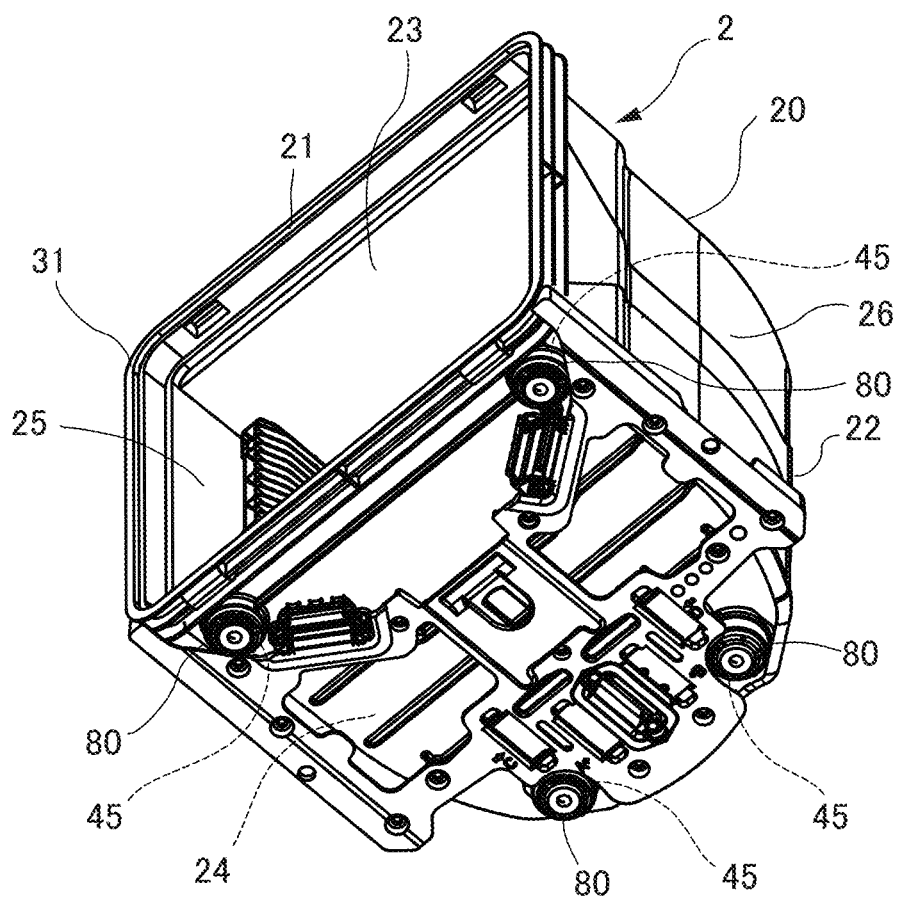
FIG. 2 is a lower perspective view illustrating a state where the gas purge filter 80 according to the first embodiment of the present invention is attached to the storing container 1.
Figure 3A:
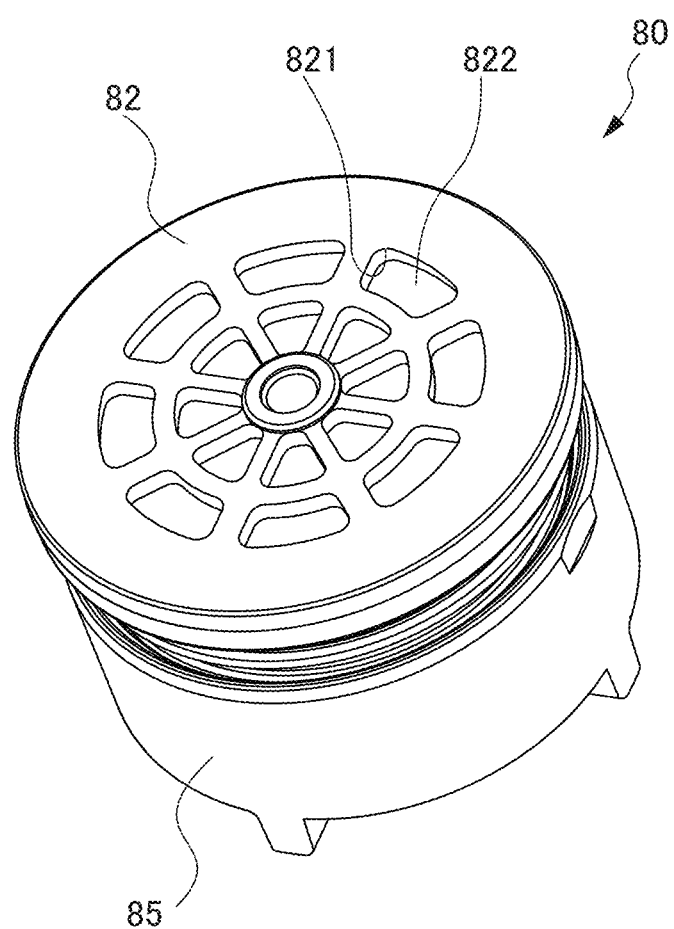
FIG. 3(A) is an upper perspective view illustrating the gas purge filter 80 according to the first embodiment of the present invention.
Figure 3B:
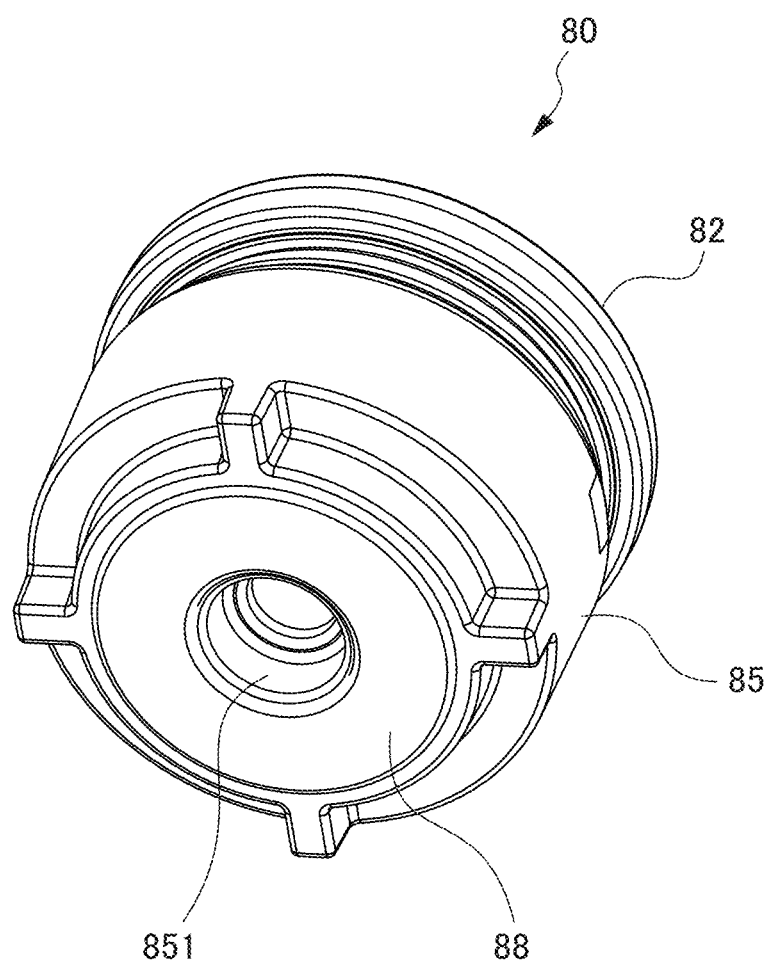
FIG. 3(B) is a lower perspective view illustrating the gas purge filter 80 according to the first embodiment of the present invention.
Figure 5:
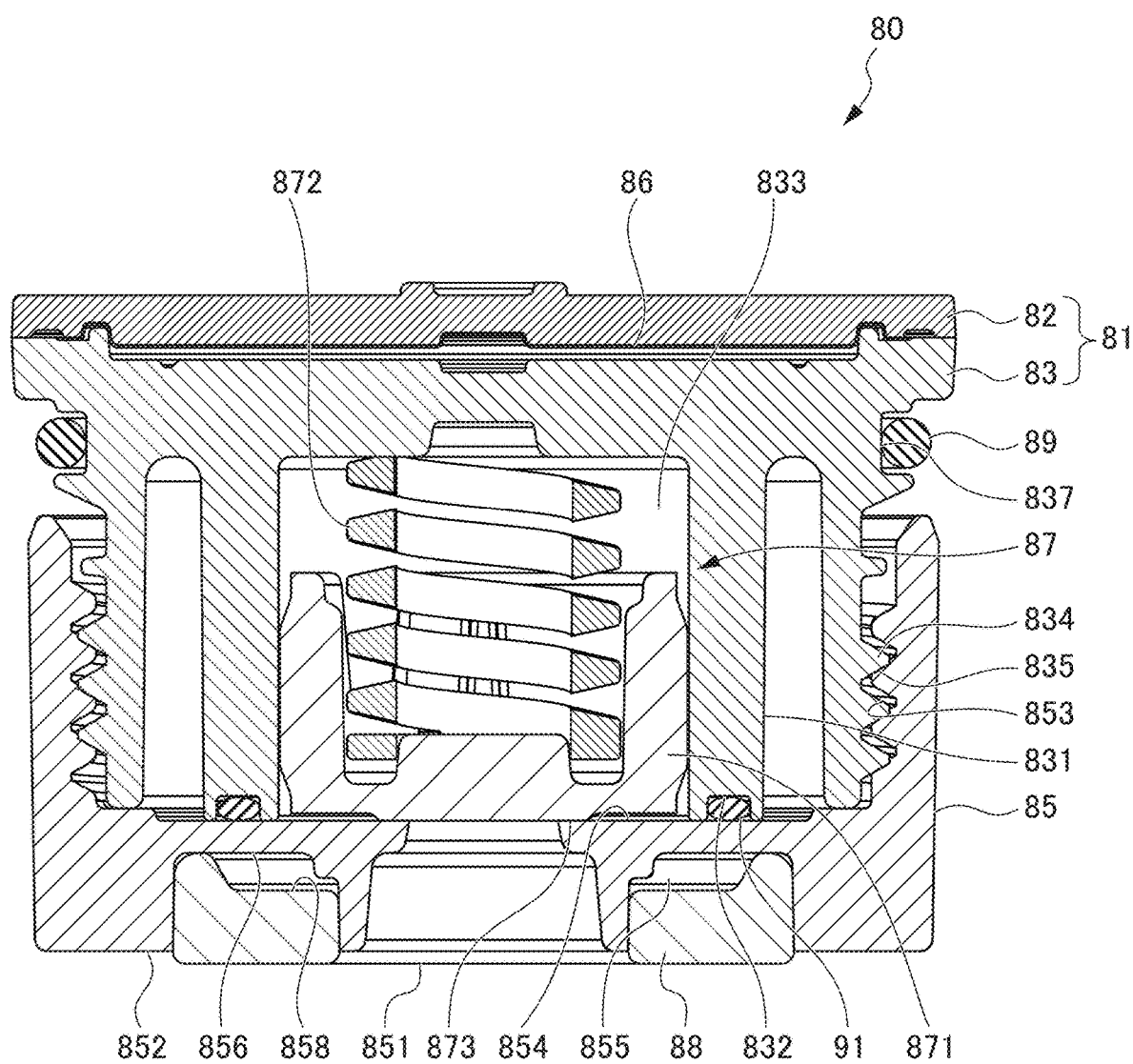
FIG. 5 is a cross-sectional view illustrating the gas purge filter 80 according to the first embodiment of the present invention.

Hereinafter, a gas purge filter 80 constituting a gas purge port according to a first embodiment of the present invention will be described with reference to the drawings. FIG. 1 is an exploded perspective view illustrating a state where the gas purge filter 80 is attached to a storing container 1 and a substrate W is stored. FIG. 2 is a lower perspective view illustrating a state where the gas purge filter 80 is attached to the storing container 1. FIG. 3(A) is an upper perspective view illustrating the gas purge filter 80. FIG. 3(B) is a lower perspective view illustrating the gas purge filter 80. FIG. 4 is an exploded perspective view illustrating the gas purge filter 80 provided in an air supply hole. FIG. 5 is a cross-sectional view illustrating the gas purge filter 80.

Here, for convenience of description, the direction from a container main body 2 (described later) toward a lid body 3 (direction from the upper right toward the lower left in FIG. 1) is defined as the forward direction, the direction opposite to the forward direction is defined as the backward direction, and the forward and backward directions are collectively defined as the forward/backward direction. In addition, the direction from a lower wall 24 (described later) toward an upper wall 23 (upper direction in FIG. 1) is defined as the upper direction, the direction opposite to the upper direction is defined as the lower direction, and the upper/lower directions are collectively defined as the upper/lower direction. In addition, the direction from a second side wall 26 (described later) toward a first side wall 25 (direction from the lower right toward the upper left in FIG. 1) is defined as the left direction, the direction opposite to the left direction is defined as the right direction, and the left and right directions are collectively defined as the left/right direction.

In addition, the substrate W (see FIG. 1) stored in the storing container 1 is a disk-shaped silicon wafer, a disk-shaped glass wafer, a disk-shaped sapphire wafer, or the like, is thin, and is used in industries. The substrate W in the present embodiment is a silicon wafer having a diameter of 300 mm to 450 mm.

The storing container 1 is used as a shipping container for transporting a substrate by means of transport such as means of transport by land, air, and sea or used as an in-process container storing the substrate W made of a silicon wafer as described above and transferring the substrate W in a process in a factory and has the container main body 2, the lid body 3, substrate support plate-like portions 5 as side substrate support portions, a back side substrate support portion (not illustrated), and a front retainer (not illustrated) as a lid body side substrate support portion as illustrated in FIG. 1.

The container main body 2 has a tubular wall portion 20. A container main body opening portion 21 is formed in one end portion of the wall portion 20. The other end portion of the wall portion 20 is blocked. A storing space 27 is formed in the container main body 2. The storing space 27 is formed so as to be surrounded by the wall portion 20. The substrate support plate-like portion 5 is disposed at the part of the wall portion 20 that forms the storing space 27. A plurality of the substrates W can be stored in the storing space 27 as illustrated in FIG. 1.

The substrate support plate-like portions 5 are provided in the wall portion 20 so as to make a pair in the storing space 27. When the container main body opening portion 21 is not blocked by the lid body 3, the substrate support plate-like portions 5 are capable of supporting the edge portions of the plurality of substrates W in a state where the adjacent substrates W are separated from each other at a predetermined interval and arranged in parallel by abutting against the edge portions of the plurality of substrates W. The back side substrate support portion (not illustrated) is provided on the back side of the substrate support plate-like portion 5.

The back side substrate support portion (not illustrated) is provided in the wall portion 20 so as to make a pair with the front retainer (not illustrated) in the storing space 27. When the container main body opening portion 21 is blocked by the lid body 3, the back side substrate support portion (not illustrated) is capable of supporting the rear portions of the edge portions of the plurality of substrates W by abutting against the edge portions of the plurality of substrates W.

The lid body 3 can be attached to and detached from an opening circumferential portion 31 (FIG. 1 and so on) forming the container main body opening portion 21 and is capable of blocking the container main body opening portion 21. The front retainer (not illustrated) is provided at the part of the lid body 3 that faces the storing space 27 when the container main body opening portion 21 is blocked by the lid body 3. The front retainer (not illustrated) is disposed so as to make a pair with the back side substrate support portion (not illustrated) in the storing space 27.

When the container main body opening portion 21 is blocked by the lid body 3, the front retainer (not illustrated) is capable of supporting the front portions of the edge portions of the plurality of substrates W by abutting against the edge portions of the plurality of substrates W. When the container main body opening portion 21 is blocked by the lid body 3, the front retainer (not illustrated) retains the plurality of substrates W in a state where the adjacent substrates W are separated from each other at a predetermined interval and arranged in parallel by supporting the plurality of substrates W in cooperation with the back side substrate support portion (not illustrated).

A resin such as a plastic material constitutes the storing container 1. Unless otherwise specified, examples of the resin of the material include thermoplastic resins such as polycarbonates, cycloolefin polymers, polyetherimide, polyetherketone, polybutylene terephthalate, polyether ether ketone, and liquid crystal polymers and alloys thereof. A conductive substance such as a carbon fiber, carbon powder, a carbon nanotube, and a conductive polymer is selectively added to the resins of the molding materials in a case where conductivity is to be added. It is also possible to add a glass fiber, a carbon fiber, or the like for the purpose of rigidity enhancement.

Hereinafter, each portion will be described in detail. As illustrated in FIG. 1 or the like, the wall portion 20 of the container main body 2 has a back wall 22, the upper wall 23, the lower wall 24, the first side wall 25, and the second side wall 26. The back wall 22, the upper wall 23, the lower wall 24, the first side wall 25, and the second side wall 26 are constituted by the material described above and are configured by being integrally molded.

The first side wall 25 and the second side wall 26 face each other. The upper wall 23 and the lower wall 24 face each other. The rear edge of the upper wall 23, the rear edge of the lower wall 24, the rear edge of the first side wall 25, and the rear edge of the second side wall 26 are connected to the back wall 22 without exception. The front edge of the upper wall 23, the front edge of the lower wall 24, the front edge of the first side wall 25, and the front edge of the second side wall 26 have a positional relationship in which the front edges face the back wall 22 and constitute the opening circumferential portion 31 forming the substantially rectangular container main body opening portion 21.

The opening circumferential portion 31 is provided in one end portion of the container main body 2. The back wall 22 is positioned in the other end portion of the container main body 2. The profile of the container main body 2 formed by the outer faces of the wall portion 20 is a box shape. The inner face of the wall portion 20, that is, the inner face of the back wall 22, the inner face of the upper wall 23, the inner face of the lower wall 24, the inner face of the first side wall 25, and the inner face of the second side wall 26 form the storing space 27 surrounded by the inner faces. The container main body opening portion 21 formed in the opening circumferential portion 31 communicates with the storing space 27 surrounded by the wall portion 20 and formed in the container main body 2. A maximum of 25 substrates W can be stored in the storing space 27.

As illustrated in FIG. 1, latch engagement concave portions 40A, 40B, 41A, and 41B concaved outward from the storing space 27 are formed at parts of the upper wall 23 and the lower wall 24 near the opening circumferential portion 31. A total of four latch engagement concave portions 40A, 40B, 41A, and 41B are respectively formed near both right and left end portions of the upper wall 23 and the lower wall 24.

As illustrated in FIG. 1, on the outer face of the upper wall 23, a rib 28 is provided by being molded integrally with the upper wall 23. The rib 28 is provided so that the rigidity of the container main body is enhanced.

A top flange 29 is fixed to the middle portion of the upper wall 23. The top flange 29 is a member becoming a part hung and suspended in the storing container 1 when the storing container 1 is suspended in an automatic wafer transfer system (AMHS), a wafer substrate transfer cart (PGV), or the like.

As illustrated in FIGS. 1 and 2, through-holes 45, which are access openings, are formed as ventilation paths at the four corners of the lower wall 24. In the present embodiment, the two through-holes 45 in the front of the lower wall 24 are exhaust holes for discharging the gas in a container and the two through-holes 45 in the back of the lower wall 24 are air supply holes for supplying gas into a container. The gas purge filter 80 is disposed in each of the through-holes 45 that are the air supply holes and the exhaust holes.

As illustrated in FIGS. 3(A), 3(B), 4, and 5, the gas purge filter 80 has a filter housing 81, a filter ring 85, a gas-permeable membrane 86, a check valve member 87, a close contact pad 88, and O-rings 89 and 91. An upper first housing 82 and a lower first housing 83 constitute the filter housing 81. The gas-permeable membrane 86 is sandwiched between the upper first housing 82 and the lower first housing 83. The upper first housing 82 and the lower first housing 83 are welded and fixed by means of ultrasonic waves.

As illustrated in FIGS. 1 and 2, in the present embodiment, the gas purge filter 80 is disposed in the lower wall 24 of the container main body 2 such that the upper first housing 82 is on the storing space 27 side. The gas purge filter 80 is not limited to being attached to the lower wall 24. The gas purge filter 80 may be attached to a lid body and a wall portion other than the lower wall 24 or may be attached to both the lower wall and the lid body.

As illustrated in FIG. 3A, a storing space side opening 821 is formed in the upper first housing 82 disposed on the storing space 27 side of the gas purge filter 80. As illustrated in FIG. 3B, a storing space outside opening 851 is formed in the filter ring 85 on the side of the gas purge filter 80 that is in the space outside the storing container 1. These openings allow the spaces inside and outside the storing container 1 to communicate with each other via the ventilation space (an upper ventilation space 822 and a lower ventilation space 833) that is formed in the gas purge filter 80. The storing space outside opening 851 is configured to be larger in diameter than the gas flow passage of the purge port supplying purge gas (described later) to the ventilation space.

With the above configuration, the gas purge filter 80 is capable of passing gas through the gas-permeable membrane 86 in the direction from the space outside the container main body 2 to the storing space 27 (hereafter, defined as "the inward direction of the storing space 27") or in the direction from the storing space 27 to the space outside the container main body 2 (hereafter, defined as "the outward direction of the storing space 27"). At that time, the gas-permeable membrane 86 performs gas filtration by blocking the particles contained in the gas and the like from passing.

As illustrated in FIG. 3A, the upper first housing 82 is provided with the upper ventilation space 822 communicating with the storing space side opening 821. The lower first housing 83 has a ventilation path forming portion 831 formed so as to project toward the outward direction of the storing space 27 (lower direction in FIG. 5). The tip end portion of the ventilation path forming portion 831 in the outward direction of the storing space 27 (lower end portion of the ventilation path forming portion 831 in FIG. 5) has a groove 832 in which the O-ring 91 is mounted. Further, the lower first housing 83 has the lower ventilation space 833 connected to the upper ventilation space 822 and formed by the ventilation path forming portion 831. Accordingly, the ventilation path that is constituted by the upper ventilation space 822 and the lower ventilation space 833 forms the ventilation space that allows the storing space side opening 821 (see FIG. 3A) of the gas purge filter 80 and the storing space outside opening 851 (see FIG. 3B) to communicate with each other.

Further, a screw portion 834 is formed in the lower first housing 83 so as to cover the radial-direction outer side of the ventilation path forming portion 831 in an annular shape. The screw portion 834 has a substantially annular tubular shape having a coaxial positional relationship with the ventilation path forming portion 831. A screw 835 is formed on the outer peripheral face of the screw portion 834.

A valve body 871 and a spring 872 for biasing the valve body 871 in a certain direction constitute the check valve member 87. The valve body 871 is disposed in the outward direction of the storing space 27 in the ventilation space in the lower first housing 83. The spring 872 is disposed between the valve body 871 and the lower first housing 83 and constitutes a compression spring biasing the valve body 871 in the outward direction of the storing space 27, which is the lower direction, with respect to the lower first housing 83. The valve body 871 can be opened and closed by the pressure of the gas that flows through the ventilation path. In other words, as illustrated in FIG. 4, a plurality of valve body peripheral face convex portions 8713 projecting outward in the radial direction of the valve body 871 are provided on the peripheral face of the cylindrical valve body 871. The valve body peripheral face convex portion 8713 has a trapezoidal shape in the circumferential direction of the valve body 871 and has a trapezoidal shape in the axial center direction of the valve body 871 (upper/lower direction in FIG. 4). The valve body peripheral face convex portion 8713 has a projecting end face abutting against the inner peripheral face of the ventilation path forming portion 831. A part 8714, which is the peripheral face of the valve body 871 and is not provided with the valve body peripheral face convex portion 8713, does not abut against the inner peripheral face of the ventilation path forming portion 831. A ventilation path is formed between the part 8714 and the inner peripheral face of the ventilation path forming portion 831. The spring constant of the spring 872 is set such that the valve body 871 can be separated from a close contact face 854 (described later) of the filter ring 85 and opened when the valve body 871 is pressed in the upper direction by gas such as the purge gas that flows through the ventilation path. When the pressing force of the gas does not act on the valve body 871, the valve body 871 remains closed by the biasing force of the spring 872.

The spring 872 of the check valve member 87 is configured by molding of a high-performance thermoplastic resin that has a relatively high level of durability and is made of at least one of polyether ether ketone, polycarbonate, and polyacetal having a tensile modulus of elasticity exceeding 2,000 Mpa when represented by Young's modulus. In the present embodiment, polyether ether ketone having a tensile modulus of elasticity exceeding 2,000 Mpa when represented by Young's modulus is used for the spring 872 of the check valve member 87.

The filter ring 85 has a substantially cylindrical shape blocked in the outward direction of the storing space 27. A screw 853 engaged with the screw 835 of the lower first housing 83 is provided on the inner diameter face of the filter ring 85. The upper face of the part in the outward direction of the storing space 27 (lower portion of the filter ring 85) that is the inner face of the filter ring 85 has the close contact face 854 constituted by a flat face.

By the filter ring 85 being screwed into the screw portion 834, each of the O-ring 91 at the tip end of the ventilation path forming portion 831 in the lower first housing 83 and a bottom face 873 of the valve body 871 of the check valve member 87 in the outward direction of the storing space 27 abuts against and comes into close contact with the close contact face 854 of the storing space 27 in the filter ring 85. As a result, airtightness is ensured for the ventilation path formed inside the ventilation path forming portion 831. In other words, airtightness is ensured for the ventilation path formed inside the ventilation path forming portion 831 by the O-ring 91 being used in the abutting portion where the tip end of the ventilation path forming portion 831 in the lower first housing 83 abuts against the close contact face 854 of the filter ring 85.

A groove 856 for mounting the close contact pad 88 is provided in the tip end portion in the outward direction of the storing space 27 that is outside the filter ring 85 (lower end portion in FIG. 5). The close contact pad 88 is formed in an annular shape having a coaxial positional relationship with the storing space outside opening 851. The tip end portion in the outward direction of the storing space 27 that is outside the filter ring 85 (lowermost face of the filter ring 85 in FIG. 5) and the face of the tip end portion of the close contact pad 88 in the outward direction (lowermost face of the close contact pad 88 in FIG. 5) have substantially the same positional relationship in the upper/lower direction. The tip end portion in the outward direction of the storing space 27 that is outside the filter ring 85 (lowermost face of the filter ring 85 in FIG. 5) constitutes a seal face 852 coming into close contact with the purge port (gas injection port, described later). In the groove 856 in a state where the close contact pad 88 is mounted, a space 855 constituting the groove 856 is formed by a concave portion 858 formed by a part of the close contact pad 88 being concaved downward. The close contact pad 88 prevents gas leakage between the seal face 852 and the purge port (not illustrated).

The gas purge filter 80 is fixed to the lower wall 24 via the O-ring 89 mounted in a groove 837 formed in the side face of the lower first housing 83. When the gas purge filter 80 is fixed to the lower wall 24, sealing is performed between the lower wall 24 and the lower first housing 83 by the O-ring 89 being used between the through-hole 45 of the lower wall 24 and the gas purge filter 80.

Polycarbonate generating a small amount of outgas is used as the material of the filter housing 81 and the filter ring 85. A thermoplastic resin causing a predetermined outgas generation amount or less may be used in place of the polycarbonate as the material of the filter housing 81 and the filter ring 85. For example, a resin such as a cycloolefin polymer, polyetherimide, and polyether ether ketone can be used. As for the material of the close contact pad 88, a polyolefin elastomer was used as an elastic member. As the material of the close contact pad 88, a resin such as polybutylene terephthalate and polyethylene, an elastomer such as a polyethylene elastomer, and a rubber material such as silicon rubber and fluororubber can be used in place of the polyolefin elastomer.

As illustrated in FIG. 1 or the like, the lid body 3 has a substantially rectangular shape that substantially matches the shape of the opening circumferential portion 31 of the container main body 2. The lid body 3 can be attached to and detached from the opening circumferential portion 31 of the container main body 2. The container main body opening portion 21 can be blocked by the lid body 3 by the lid body 3 being mounted in the opening circumferential portion 31. An annular sealing member 4 is attached to the inner face of the lid body 3 (rear face of the lid body 3 illustrated in FIG. 1). The face faces a face (sealing face 30) of the step part formed at a position directly behind the opening circumferential portion 31 at a time when the lid body 3 blocks the container main body opening portion 21. The sealing member 4 is made of various types of elastically deformable thermoplastic elastomers such as polyester-based elastomers and polyolefin-based elastomers, fluororubber, silicon rubber, or the like. The sealing member 4 is disposed so as to go around the outer circumferential edge portion of the lid body 3.

When the lid body 3 is mounted in the opening circumferential portion 31, the sealing member 4 is elastically deformed by being sandwiched between the sealing face 30 and the inner face of the lid body 3 and the lid body 3 blocks the container main body opening portion 21 in a sealed state. By the lid body 3 being removed from the opening circumferential portion 31, the substrate W can be taken in and out of the storing space 27 in the container main body 2.

The lid body 3 is provided with a latch mechanism. The latch mechanism is provided near both right and left end portions of the lid body 3. As illustrated in FIG. 1, the latch mechanism is provided with two upper side latch portions 32A and 32B capable of projecting upward from the upper side of the lid body 3 and two lower side latch portions (not illustrated) capable of projecting downward from the lower side of the lid body 3. The two upper side latch portions 32A and 32B are disposed near both right and left ends of the upper side of the lid body 3. The two lower side latch portions are disposed near both right and left ends of the lower side of the lid body 3.

An operation portion 33 is provided on the outer face of the lid body 3. By operating the operation portion 33 from the front side of the lid body 3, it is possible to cause the upper side latch portions 32A and 32B and the lower side latch portions (not illustrated) to project from the upper and lower sides of the lid body 3 and cause the upper side latch portions 32A and 32B and the lower side latch portions (not illustrated) not to project from the upper and lower sides. The upper side latch portions 32A and 32B are engaged with the latch engagement concave portions 40A and 40B of the container main body 2 by projecting upward from the upper side of the lid body 3 and the lower side latch portions (not illustrated) are engaged with the latch engagement concave portions 41A and 41B of the container main body 2 by projecting downward from the lower side of the lid body 3. As a result, the lid body 3 is fixed to the opening circumferential portion 31 of the container main body 2.

A concave portion (not illustrated) concaved outward from the storing space 27 is formed on the inner side of the lid body 3. The front retainer (not illustrated) is fixedly provided in the concave portion (not illustrated) and the part of the lid body 3 that is outside the concave portion.

The front retainer (not illustrated) has front retainer substrate receiving portions (not illustrated). The front retainer substrate receiving portions (not illustrated) are disposed two by two so as to make a pair and at a predetermined interval in the left/right direction. The front retainer substrate receiving portions disposed two by two so as to make a pair as described above are provided in a state where 25 pairs are arranged in parallel in the upper/lower direction. The front retainer substrate receiving portions sandwich and support the end edge of the edge portion of the substrate W by the substrate W being stored in the storing space 27 and the lid body 3 being closed.

In the gas purge filter 80 as described above, gas replacement (gas purging) by means of a gas purge device is performed as follows. When the storing container 1 is used as an in-process container in a process in a factory, the lower wall 24 is positioned in the lower portion and the upper wall 23 is positioned in the upper portion in the container main body 2. The gas purge filter 80 of the storing container 1 is used for two gas purging methods. One pertains to a case where gas purging is performed with the lid body 3 blocking the container main body opening portion 21 of the container main body 2 and the other pertains to a case where gas purging is performed with the lid body 3 removed from the storing container 1. The state where the container main body 2 is blocked by the lid body 3 will be described below.

In a state where the container main body opening portion of the container main body 2 is closed by the lid body 3, the purge port tip end portion of the purge port of the gas purge device (not illustrated) abuts against the lower end portion of the gas purge filter 80 provided in the through-hole 45 of the lower wall 24 of the container main body 2. At this time, the elastic body-based close contact pad 88 is provided in the tip end portion in the outward direction of the storing space 27 that is outside the filter ring 85 (lower end portion of the gas purge filter 80 in FIG. 5). Accordingly, when the purge port (not illustrated) abuts against the close contact pad 88, airtightness (seal) between the tip end portion of the purge port and the lower end portion of the gas purge filter is reliably performed.

Subsequently, purge gas is supplied from the gas purge device (not illustrated). The purge gas supplied from the purge gas flow passage of the gas purge device (not illustrated) presses the valve body 871 from the lower side in FIG. 5 in the gas purge filters 80 provided in the two through-holes 45 in the back of the lower wall 24 (air supply holes for supplying gas into a container), the valve body 871 is opened by the pressure of the purge gas, the purge gas passes through the ventilation path formed between the inner peripheral face of the ventilation path forming portion 831 and the part 8714 (see FIG. 4), which is the peripheral face of the valve body 871 and is not provided with the valve body peripheral face convex portion 8713, the purge gas passes through the upper ventilation space 822 and the lower ventilation space 833 constituting the ventilation space, and the purge gas is supplied to the storing space 27 of the storing container 1. At this time, the purge gas is filtered such that unnecessary particles do not enter the storing space 27 by the purge gas passing through the gas-permeable membrane 86. Gas purging is performed by the gas in the storing container 1 being discharged to the outside of the storing container 1 from the other gas purge filters 80 provided in the two through-holes 45 in the front of the lower wall 24 (exhaust holes for discharging the gas in a container). The other gas purge filter 80 provided in the exhaust hole will be described later as a second embodiment.

When the gas purging described above is performed, the gas flow passage of the purge port (not illustrated) is smaller in diameter than the storing space outside opening 851 of the gas purge filter 80. Accordingly, the gas purging is performed with the purge gas released from the purge gas flow passage supplied without exception to the nozzle portion ventilation space formed in the storing container through the ventilation path in the gas purge filter 80.

The following effects can be obtained by means of the gas purge filter 80 according to the first embodiment configured as described above. In the storing container 1, the storing space 27 is formed by the container main body 2 and the lid body 3. The container main body 2 has the container main body opening portion 21 in one end portion. The lid body 3 can be attached to and detached from the container main body opening portion 21 and is capable of blocking the container main body opening portion 21. In the storing container 1, the gas purge filter 80 as a gas purge port is attached to the through-hole 45 as an access opening. The through-hole 45 is formed in the container main body 2 and is capable of allowing communication between the storing space 27 and the space outside the storing container 1. The gas purge filter 80 is provided with the pipe-shaped ventilation path forming portion 831, the check valve member 87, and the seal face 852. The ventilation path forming portion 831 has the ventilation path capable of allowing ventilation between the storing space 27 and the space outside the storing container 1. The check valve member 87 has the spring 872 and the valve body 871 and limits the gas flow direction in the ventilation path to a certain direction. The spring 872 is a resin-molded spring prevented from being corroded by gas. The valve body 871 is biased by the spring 872. The seal face 852 is provided in the filter ring 85, which is a part of the gas purge filter 80 other than the ventilation path forming portion 831 and the check valve member 87. The seal face 852 comes into close contact with the purge port as a gas injection port. The seal face 852 is provided with the elastic body-based close contact pad 88 for preventing gas leakage between the purge port and the seal face 852.

With the above configuration, sealing can be reliably performed between the close contact pad 88 and the purge port (not illustrated) by the close contact pad 88 being elastically deformed.

The spring 872 is molded with a thermoplastic resin having a tensile modulus of elasticity exceeding 2,000 Mpa when represented by Young's modulus. More specifically, the thermoplastic resin is made of at least one of polyether ether ketone, polycarbonate, and polyacetal. With this configuration, it is possible to prevent a metal component in the spring 872 from being contained in the purge gas, prevent the metal from falling due to corrosion, and prevent particles from adhering to the inner portion of the storing container 1 and the environment in the storing container 1 can be kept clean. As a result, it is possible to suppress a decline in semiconductor chip yield.

The valve body 871 can be opened and closed by the pressure of the purge gas that flows through the ventilation path. With this configuration, the purge gas is capable of easily opening the valve body 871 and flowing into the storing space 27 through the ventilation path in the gas purge filter 80 during gas purging by means of the purge gas.

The close contact pad 88 is formed in an annular shape. With this configuration, abutting against the purge port (not illustrated) is possible over the entire circumference of the annular close contact pad 88. As a result, sealing can be reliably performed between the purge port and the close contact pad 88.

The gas purge filter 80 is provided with the gas-permeable membrane 86 for filtration. With this configuration, it is possible to block the particles contained in the purge gas or the like from passing through the gas-permeable membrane 86 and gas such as the purge gas can be filtered.

The close contact face 854 and the end face of the valve body 871 in the lower direction abut against each other on a face, and thus inclination of the valve body 871 can be suppressed, friction attributable to sliding between the outer face of the check valve member 87 and the inner face of the ventilation path forming portion 831 can be suppressed, and particle generation can be suppressed.

Next, the gas purge filter 80 according to the second embodiment of the present invention will be described. The second embodiment is different from the first embodiment in that the positional relationship between the valve body 871 and the spring 872 is reversed. The first and second embodiments are identical to each other as to the other configurations, and thus the same members will not be described below.

The valve body 871 is turned upside down. In other words, the valve body 871 is disposed such that the blocked end portion of the cylindrical valve body 871 is on the upper side by being turned upside down from the valve body 871 illustrated in FIGS. 4 and 5, the upper end portion of the spring 872 abuts against the valve body 871, and the lower end portion of the spring 872 abuts against the close contact face 854 of the filter ring 85. In the valve body 871 disposed as described above, the valve body 871 is moved downward against the biasing force of the spring 872 by the air that flows to the outside of the storing container 1 from the storing space 27 and the valve is opened as a result. In contrast, the valve body 871 is moved upward by the flow of gas such as air to flow into the storing space 27 from the outside of the storing container 1 and the biasing force of the spring 872. Then, the valve body 871 abuts against the upper portion of the lower first housing 83 and the valve is closed as a result. The gas purge filter 80 as a gas purge port in the present embodiment is used after being fixed to the through-holes 45 as the two exhaust holes in the front of the lower wall 24.

Figure 6:
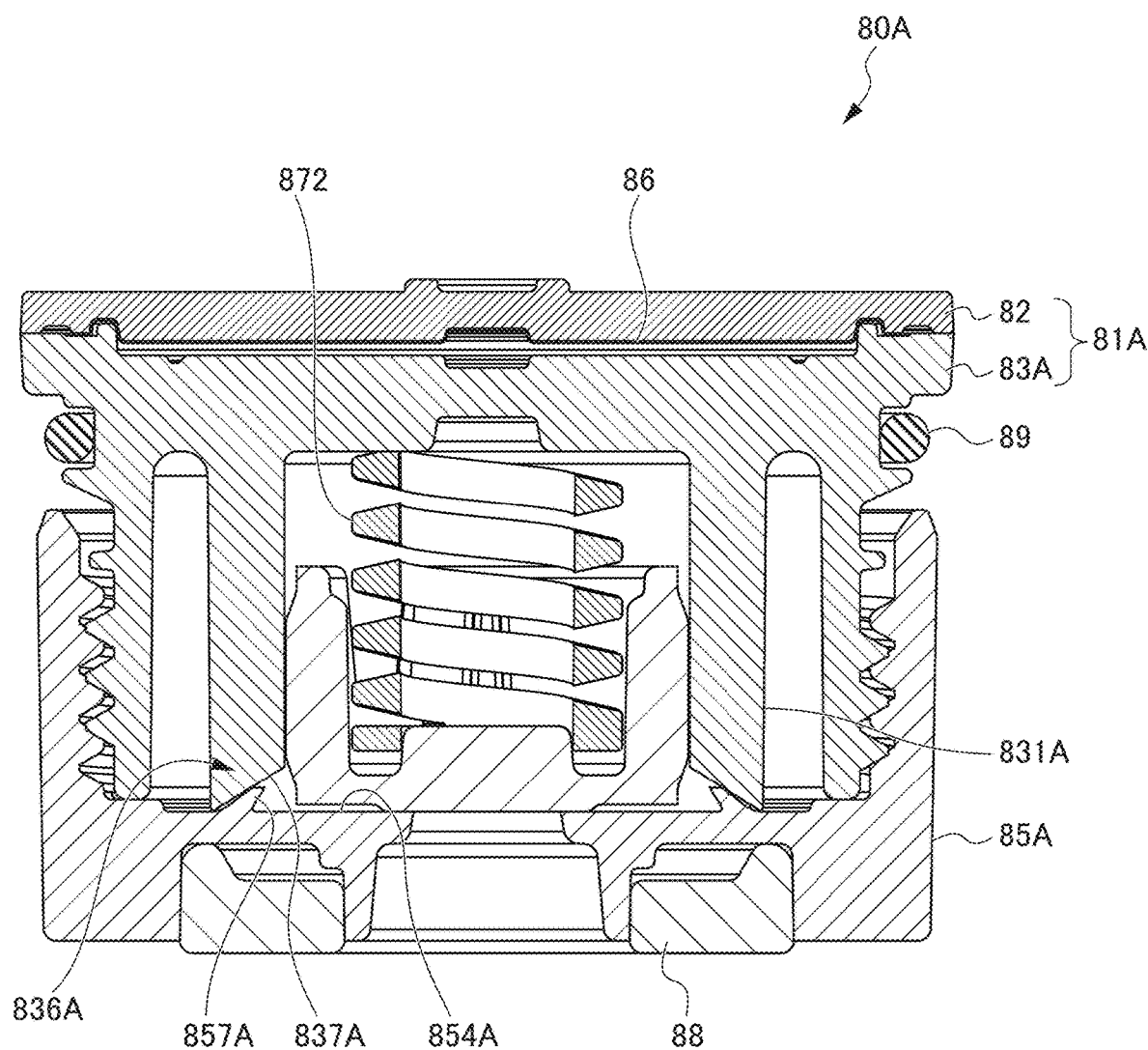
FIG. 6 is a cross-sectional view illustrating a gas purge filter 80A according to a third embodiment of the present invention.

Next, a gas purge filter 80A according to a third embodiment of the present invention will be described with reference to the drawings. FIG. 6 is a cross-sectional view illustrating the gas purge filter 80A.

The third embodiment is different from the first embodiment in that the O-ring 91 is not provided. The first and third embodiments are identical to each other as to the other configurations, and thus the same members will be denoted by the same reference numerals without redundant descriptions.

As illustrated in FIG. 6, the lower end portion of a ventilation path forming portion 831A has a tapered portion 836A, which is an inclined face 837A having a tip narrowing upward in a side view cross section. An annular convex portion 857A projecting upward is provided at the part of a close contact face 854A of a filter ring 85A that faces the tapered portion of the ventilation path forming portion 831A in the upper/lower direction. The annular convex portion 857A is provided in an annular shape with a positional relationship in which the annular convex portion 857A faces the entire circumference of the lower end portion of the ventilation path forming portion 831A. By the filter ring 85A being screwed into the screw portion 834, the tapered portion 836A abuts against the annular convex portion 857A and the annular convex portion 857A is deformed as illustrated in FIG. 6 and comes into close contact with the tapered portion 836A. As a result, airtightness is ensured between the ventilation path formed in the ventilation path forming portion 831A and the outside of the ventilation path forming portion 831A.

As described above, the ventilation path forming portion 831A is provided with the tapered portion 836A having the tapered inclined face 837A for performing sealing between the ventilation path forming portion 831A and the outside of the ventilation path forming portion 831A. Accordingly, a configuration having an O-ring or the like for such sealing is unnecessary and it is possible to seal the ventilation path in the ventilation path forming portion 831A with respect to the outside of the ventilation path forming portion 831A with a small number of components.

Figure 7:
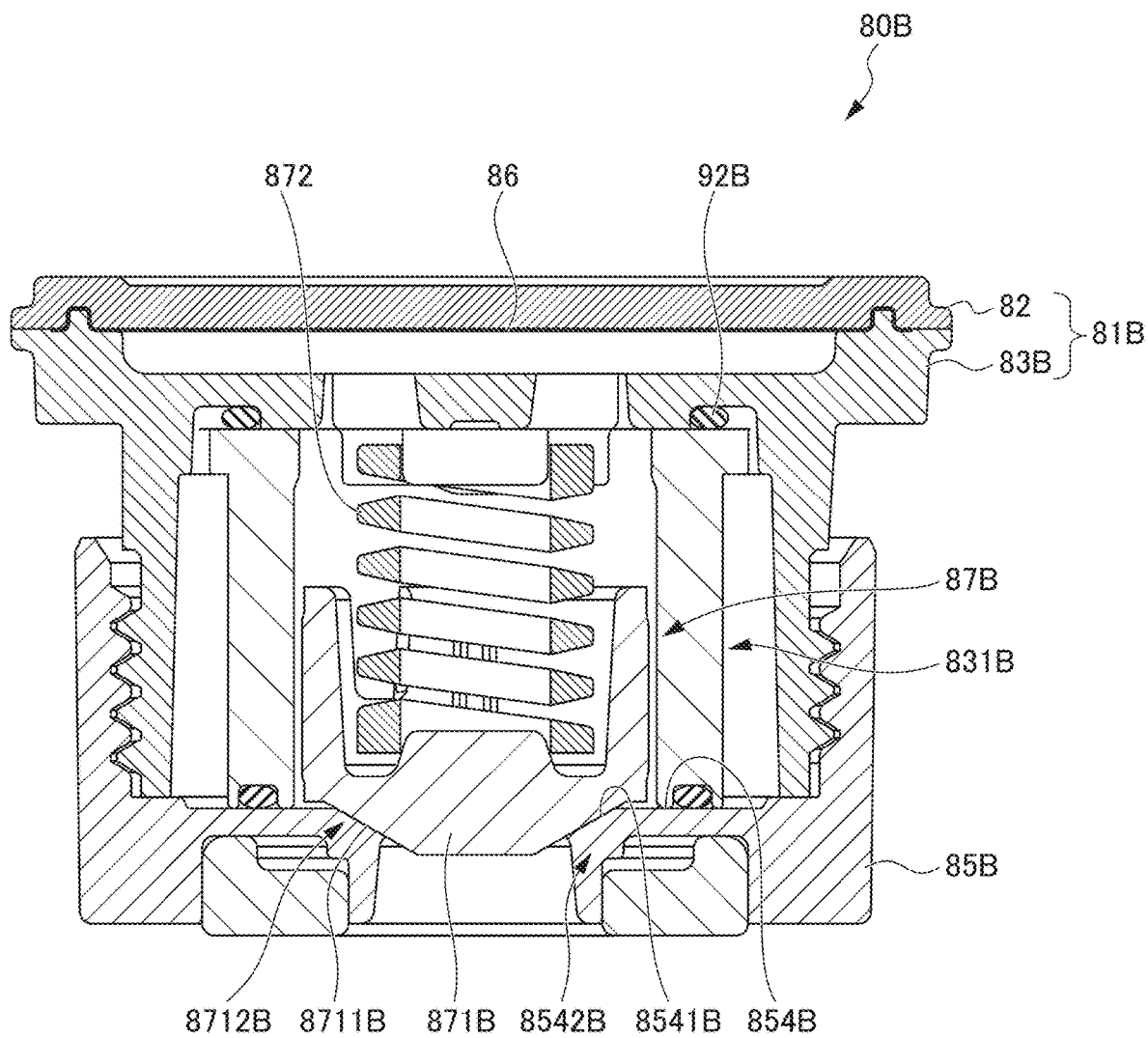
FIG. 7 is a cross-sectional view illustrating a gas purge filter 80B according to a fourth embodiment of the present invention.

Next, a gas purge filter 80B according to a fourth embodiment of the present invention will be described with reference to the drawings. FIG. 7 is a cross-sectional view illustrating the gas purge filter 80B.

The shapes of a valve body 871B, a lower first housing 83B, a ventilation path forming portion 831B, and a filter ring 85B according to the fourth embodiment are different from the shapes of the valve body 871, the lower first housing 83, the ventilation path forming portion 831, and the filter ring 85 according to the first embodiment. The first and fourth embodiments are identical to each other as to the other configurations, and thus the same members will be denoted by the same reference numerals without redundant descriptions.

The ventilation path forming portion 831B is configured separately from the lower first housing 83B. Specifically, the ventilation path forming portion 831B has a cylindrical shape open at both ends, a part of the upper end portion of the ventilation path forming portion 831B abuts via an O-ring 92B disposed in the concave portion that is formed in the lower face of the upper portion of the lower first housing 83B, and the other part of the upper end portion of the ventilation path forming portion 831B abuts directly against the lower face of the upper portion of the lower first housing 83B. The upper end portion of the spring 872 is directly supported by the upper middle part of the lower first housing 83B.

The middle portion of a close contact face 854B of the filter ring 85B constituting a valve seat has a tapered portion 8542B having a tapered face 8541B, which has a tip narrowing downward. The lower face of the valve body 871B facing the tapered portion 8542B has a valve body tapered portion 8712B having a valve body tapered face 8711B, which has a tip narrowing downward. The tapered face 8541B and the valve body tapered face 8711B have matching shapes allowing abutting on a face. In this configuration, the ventilation path is closed and sealed by the valve body 871B as a result of the face abutting as described above.

The check valve member 87 closes and seals the ventilation path by the valve body 871B having a tapered shape as described above and abutting against the close contact face 854B, which constitutes the tapered stool seat of a check valve member 87B. Accordingly, the tapered face 8541B and the valve body tapered face 8711B are face-abuttable. Accordingly, the ventilation path can be reliably sealed by the valve body 871B.

Figure 8:
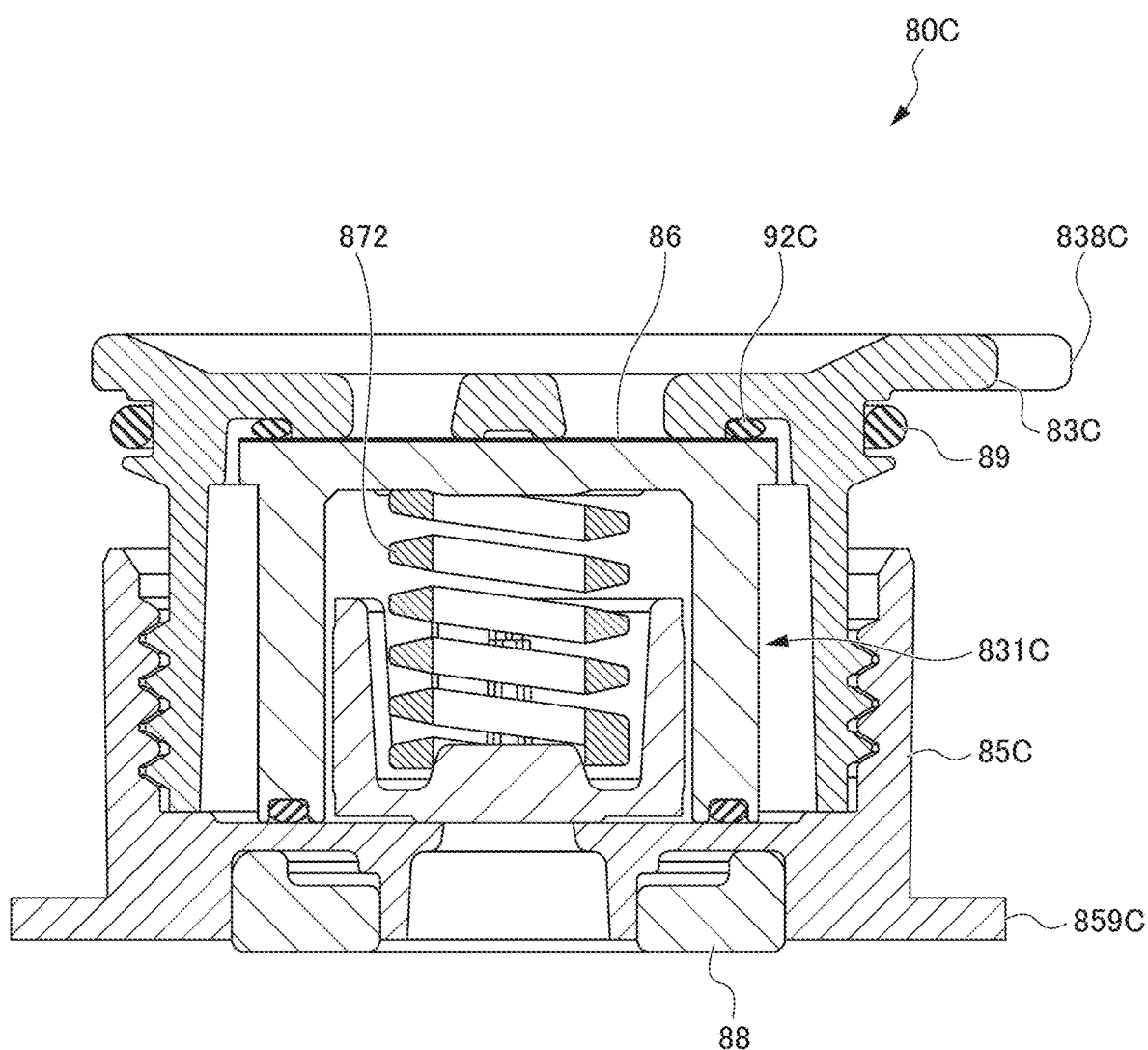
FIG. 8 is a cross-sectional view illustrating a gas purge filter 80C according to a fifth embodiment of the present invention.

Next, a gas purge filter 80C according to a fifth embodiment of the present invention will be described with reference to the drawings. FIG. 8 is a cross-sectional view illustrating the gas purge filter 80C.

The shapes of a lower first housing 83C, a filter ring 85C, and a ventilation path forming portion 831C according to the fifth embodiment are different from the shapes of the lower first housing 83, the filter ring 85, and the ventilation path forming portion 831 according to the first embodiment. The first and fifth embodiments are identical to each other as to the other configurations, and thus the same members will be denoted by the same reference numerals without redundant descriptions.

As is the case with the fourth embodiment, the ventilation path forming portion 831C is configured separately from the lower first housing 83C. Specifically, the ventilation path forming portion 831C is cylindrical and has a blocked upper end portion. A part of the upper end portion of the ventilation path forming portion 831C abuts via the gas-permeable membrane 86 and an O-ring 92C disposed in the concave portion that is formed in the lower face of the upper portion of the lower first housing 83C. The other part of the upper end portion of the ventilation path forming portion 831C abuts against the lower face of the upper portion of the lower first housing 83C via the gas-permeable membrane 86. The upper end portion of the spring 872 abuts against the lower face of the upper middle part of the ventilation path forming portion 831C.

The lower end portion of the filter ring 85C has a flange portion 859C spreading in a direction orthogonal to the upper/lower direction. The upper end portion of the lower first housing 83C has a flange portion 838C spreading in a direction orthogonal to the upper/lower direction.

Figure 9:
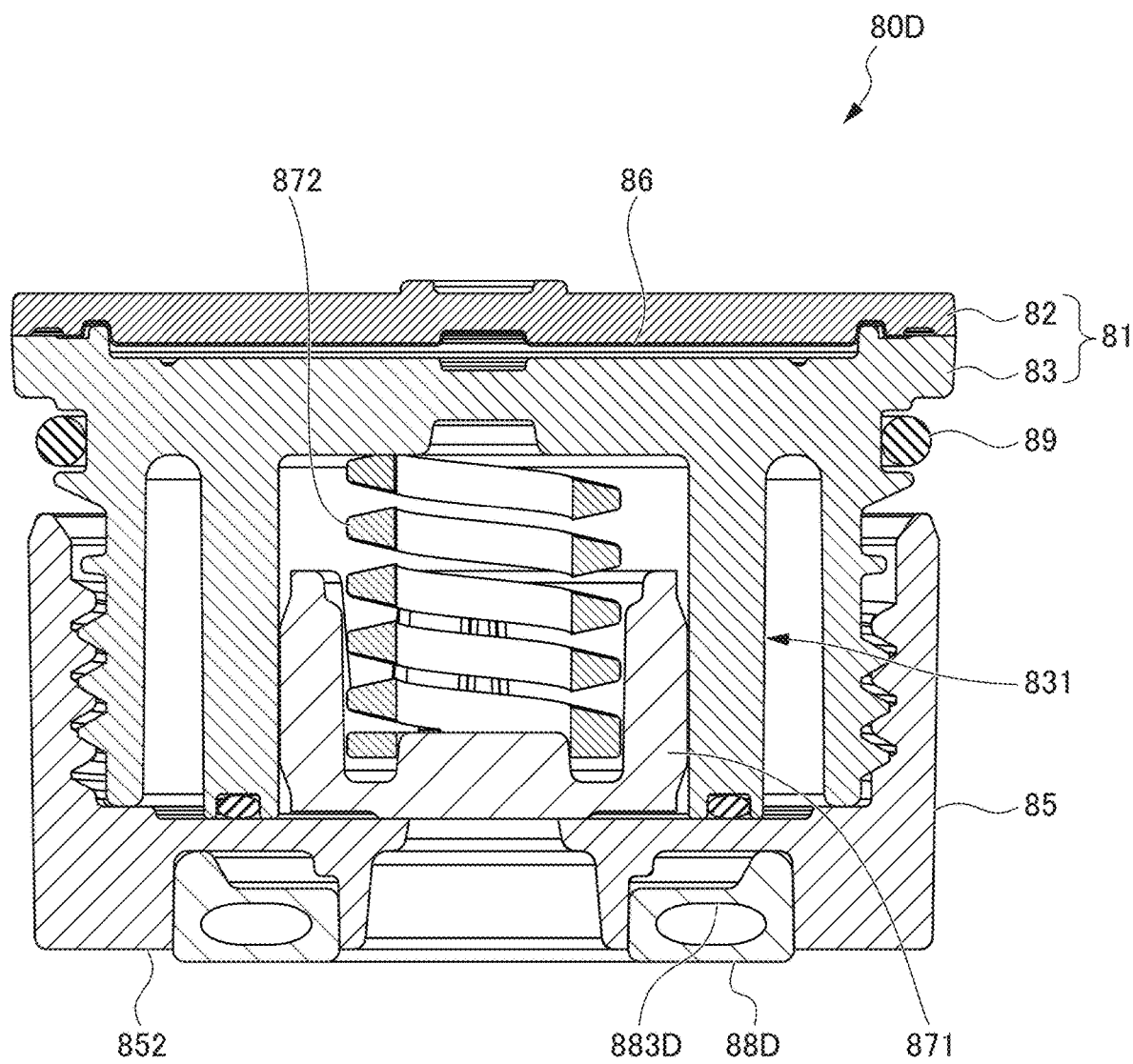
FIG. 9 is a cross-sectional view illustrating a gas purge filter 80D according to a sixth embodiment of the present invention.

Next, a gas purge filter 80D according to a sixth embodiment of the present invention will be described with reference to the drawings. FIG. 9 is a cross-sectional view illustrating the gas purge filter 80D.

The configuration of a close contact pad 88D according to the sixth embodiment is different from the configuration of the close contact pad 88 according to the first embodiment. The first and sixth embodiments are identical to each other as to the other configurations, and thus the same members will be denoted by the same reference numerals without redundant descriptions.

As illustrated in FIG. 9, the close contact pad 88D has a hollow portion 883D in which a space is formed. With this configuration, the close contact pad 88 can be easily expanded and contracted and is capable of following the purge port (not illustrated) with further (or more) ease. As a result, sealing can be reliably performed between the purge port (not illustrated) and the close contact pad 88D.

The present invention is not limited to the embodiments described above and can be modified within the technical scope described in the claims.

For example, although the seal face 852 is provided in the groove 856 formed in the filter ring 85, which is a part of the check valve member 87 other than the ventilation path forming portion 831, in the present embodiment, the present invention is not limited to this configuration. For example, the seal face may be provided in the ventilation path forming portion in a case where the ventilation path forming portion extends up to the lower end portion of the gas purge filter. Even in this case, the close contact pad may be provided on the seal face.

Although the spring 872 is made of at least one of polyether ether ketone, polycarbonate, and polyacetal, the present invention is not limited to this configuration. The spring 872 may be molded with a thermoplastic resin having a tensile modulus of elasticity exceeding 2,000 Mpa when represented by Young's modulus.

Although the two through-holes 45 in the front of the lower wall 24 are exhaust holes for discharging the gas in a container and the two through-holes 45 in the back of the lower wall 24 are air supply holes for supplying gas into a container in the present embodiment, the present invention is not limited to this configuration. For example, the through-hole 45 in the front of the lower wall 24 may be an air supply hole for supplying gas to the storing space 27 in a container and the purge port of the gas purge device abutting against the gas purge filter 80 in the first embodiment provided in the front through-hole 45 may supply purge gas. In addition, the rear through-hole 45 may be an exhaust hole for exhausting the gas in a container and the air in the storing space 27 may be exhausted at the purge port of the gas purge device abutting against the gas purge filter 80 in the second embodiment provided in the rear through-hole 45.

Although the close contact face 854 and the end face of the valve body 871 in the lower direction (bottom face 873) abut against each other on a face and are sealed in the present embodiment, the bottom face of the valve body and the close contact face may be sealed with an O-ring.

The shapes of the gas purge port, the container main body, and the lid body and the number and dimensions of the substrates W that can be stored in the container main body are not limited to the shapes of the gas purge filters 80, 80A, 80B, 80C, and 80D, the container main body 2, and the lid body 3 and the number and dimensions of the substrates W that can be stored in the container main body 2 in the present embodiment. In other words, for example, the configuration of each portion such as the ventilation path forming portion, the spring, the valve body, the check valve member, the seal face, and the close contact pad is not limited to the configuration of each portion such as the ventilation path forming portion 831, the spring 872, the valve body 871, the check valve member 87, the seal face 852, and the close contact pad 88 in the present embodiment. Likewise, the configurations of the side substrate support portion, the lid body side substrate support portion, the back side substrate support portion, and so on are not limited to the configurations of the substrate support plate-like portion 5, a front retainer 7, the back side substrate support portion (not illustrated), and so on. Although the substrate W in the present embodiment is a silicon wafer having a diameter of 300 mm to 450 mm, the diameter is not limited to this value.

EXPLANATION OF REFERENCE NUMERALS

1 STORING CONTAINER
2 CONTAINER MAIN BODY
3 LID BODY
21 CONTAINER MAIN BODY OPENING PORTION
27 STORING SPACE
45 THROUGH-HOLE
80, 80A, 80B, 80C, 80 GAS PURGE FILTER
85 FILTER RING
86 GAS-PERMEABLE MEMBRANE
87 CHECK VALVE MEMBER
88 CLOSE CONTACT PAD
831 VENTILATION PATH FORMING PORTION
852 SEAL FACE
871 VALVE BODY
872 SPRING

The invention claimed is:

1. A gas purge port attached to an access opening in a storing container in which a storing space is formed by a container main body and a lid body, the container main body having a container main body opening portion in one end portion, the lid body being attachable to and detachable from the container main body opening portion and capable of blocking the container main body opening portion, and the access opening being formed in at least one of the container main body and the lid body and capable of allowing communication between a space outside the storing container and the storing space, the gas purge port comprising:
   a pipe-shaped ventilation path forming portion where a ventilation path capable of allowing ventilation between the outside of the storing container and the storing space is formed;
   a check valve member having a resin-molded spring prevented from being corroded by gas and a valve body biased by the spring and limiting a gas flow direction in the ventilation path to a certain direction; and
   a seal face provided in at least one of the ventilation path forming portion and a part of the gas purge port other than the ventilation path forming portion and the check valve member and coming into close contact with a gas injection port,
   wherein the seal face is provided with a close contact pad constituted by an elastic body for preventing gas leakage between the gas injection port and the seal face, and
   a tip end portion of the ventilation path forming portion and a filter ring having a storing space outside opening allowing communication between the ventilation path and a gas flow passage of the gas injection port abut against each other and the abutting results in airtightness between a tip end of the ventilation path forming portion and the filter ring.

2. The gas purge port according to claim 1, wherein the spring is molded with a thermoplastic resin having a tensile modulus of elasticity exceeding 2,000 Mpa when represented by Young's modulus.

3. The gas purge port according to claim 2, wherein the thermoplastic resin is made of at least one of polyether ether ketone, polycarbonate, and polyacetal.

4. The gas purge port according to claim 1, wherein the valve body can be opened and closed by pressure of gas flowing through the ventilation path.

5. The gas purge port according to claim 1, wherein the close contact pad is formed in an annular shape.

6. The gas purge port according to claim 5, wherein a hollow portion is formed in the close contact pad such that the close contact pad is capable of following the gas injection port.

7. The gas purge port according to claim 1, wherein the ventilation path forming portion has a tapered face for performing sealing between the ventilation path and an outside of the ventilation path.

8. The gas purge port according to claim 1, wherein the check valve member closes and seals a ventilation path by the valve body having a tapered shape and abutting against a tapered stool seat of the check valve member.

9. The gas purge port according to claim 1, comprising a gas-permeable membrane for filtration.

* * * * *